(12) United States Patent
Leung et al.

(10) Patent No.: US 9,443,791 B2
(45) Date of Patent: Sep. 13, 2016

(54) LEADLESS SEMICONDUCTOR PACKAGE AND METHOD

(71) Applicant: NXP B.V., Eindhoven (NL)

(72) Inventors: Chi Ho Leung, Kwun Tong (HK); Ke Xue, Kwai Chung (HK); Soenke Habenicht, Hamburg (DE); Wai Hung William Hor, Tsuen Wan (HK); San Ming Chan, Tsuen Wan (HK); Wai Keung Ng, Tuen Mun (HK)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/801,635

(22) Filed: Jul. 16, 2015

(65) Prior Publication Data

US 2016/0035651 A1 Feb. 4, 2016

(30) Foreign Application Priority Data

Aug. 1, 2014 (EP) ..................................... 14179517

(51) Int. Cl.
| | |
|---|---|
| *H01L 23/48* | (2006.01) |
| *H01L 23/495* | (2006.01) |
| *H01L 21/56* | (2006.01) |
| *H01L 23/00* | (2006.01) |
| *H01L 21/78* | (2006.01) |
| *H01L 23/31* | (2006.01) |

(52) U.S. Cl.
CPC ........... *H01L 23/4952* (2013.01); *H01L 21/56* (2013.01); *H01L 21/561* (2013.01); *H01L 21/78* (2013.01); *H01L 23/49541* (2013.01); *H01L 23/49582* (2013.01); *H01L 24/85* (2013.01); *H01L 24/97* (2013.01); *H01L 23/3121* (2013.01); *H01L 2224/32245* (2013.01); *H01L 2224/48247* (2013.01); *H01L 2224/48465* (2013.01); *H01L 2224/4903* (2013.01); *H01L 2224/73265* (2013.01); *H01L 2224/97* (2013.01); *H01L 2924/19107* (2013.01)

(58) Field of Classification Search
CPC .................................................. H01L 23/4952
See application file for complete search history.

(56) References Cited

U.S. PATENT DOCUMENTS

| | | | |
|---|---|---|---|
| 8,076,181 B1 | 12/2011 | Pruitt et al. | |
| 2006/0035414 A1* | 2/2006 | Park | H01L 21/561 438/124 |
| 2010/0187663 A1 | 7/2010 | Celaya et al. | |
| 2012/0292755 A1* | 11/2012 | Wang | H01L 21/561 257/676 |
| 2013/0302945 A1* | 11/2013 | Li | H01L 21/78 438/113 |
| 2014/0035113 A1 | 2/2014 | Kierse | |
| 2014/0042599 A1 | 2/2014 | Wu et al. | |

FOREIGN PATENT DOCUMENTS

WO 2012/040873 A1 4/2012

OTHER PUBLICATIONS

Extended European Search Report for EP Patent Appln. No. 14179517.9 (Feb. 9, 2015).

* cited by examiner

*Primary Examiner* — William Harriston

(57) ABSTRACT

A method of forming semiconductor devices on a leadframe structure. The leadframe structure comprising an array of leadframe sub-structures each having a semiconductor die arranged thereon. The method comprises; providing electrical connections between terminals of said lead frame sub-structures and said leadframe structure; encapsulating said leadframe structure, said electrical connections and said terminals in an encapsulation layer; performing a first series of parallel cuts extending through the leadframe structure and the encapsulation layer to expose a side portion of said terminals; electro-plating said terminals to form metal side pads; and performing a second series of parallel cuts angled with respect to the first series of parallel cuts, the second series of cuts extending through the lead frame structure and the encapsulation layer to singulate a semiconductor device from the leadframe structure.

15 Claims, 7 Drawing Sheets

LEADLESS SEMICONDUCTOR PACKAGE AND METHOD

CROSS-REFERENCE TO RELATED APPLICATIONS

This application claims the priority under 35 U.S.C. §119 of European patent application no. 14179517.9, filed on Aug. 1, 2014, the contents of which are incorporated by reference herein.

FIELD

The present invention relates to a method of forming a leadless packaged semiconductor device. The invention also relates to a leadless packaged semiconductor device.

BACKGROUND

Leadless packaged semiconductor devices are known to provide advantages over leaded packages. Those advantages include better electrical performance in terms of reduced lead inductance, good heat dissipation by use of an exposed thermal pad to improve heat transfer to a PCB (printed circuit board), reduced package thickness and smaller footprint, which reduces the area occupied on a PCB. Examples of leadless packaged semiconductor devices include QFN (quad-flat no-lead devices) and DFN (discrete-flat no-lead devices). However, a disadvantage of leadless packaged semiconductor devices is that inspection of solder joints when mounted on a PCB can be difficult. Conventional inspection techniques utilise so-called Automated Optical Inspection (AOI) systems, whereby a camera scans the leadless packaged semiconductor devices mounted on the PCB for a variety of defects such as open circuit connections, short circuit connections, thinning of the solder connections and incorrectly placed devices. Due to the semiconductor device I/O terminals being arranged on the bottom of the device, and therefore hidden from view when the device is mounted a PCB, it is not generally possible to use AOI systems with leadless semiconductor devices. Automatic XRay Inspection (AXI) systems may allow inspection of solder joints, however AXI systems are expensive.

A solution allowing solder joints to be inspected by AOI is to include a metal side pads which extend from the device I/O terminals on the bottom of the device at least partially up external sidewall of the device. Typically the metal side pads may be formed of tin, lead or tin-lead alloys. During soldering processes attaching the device to the PCB, the solder will wet the I/O terminal on the bottom of the device and also the metal side pads. As a result a portion of the solder joint will be visible allowing inspection by AOI techniques. The solder joint may be considered good, provided that the metal side pads are correctly soldered even if the I/O terminal is not correctly soldered to the PCB.

In addition to ease of inspection, metal side pads may reduce tilting of the device when mounted on a PCB. Metal side pads may also improve shearing and bending performance because of the increased soldered area.

Typically, a package structure will comprise an array of device dies embedded in an encapsulation layer. The device dies will be connected to a leadframe by any appropriate means, such as eutectic bonds. The process of forming a such leadless device involves dividing a two dimensional array of encapsulated integrated circuits into individual semiconductor device packages using a series of parallel row cuts and parallel column cuts. The first series of parallel cuts extend fully through the leadframe and encapsulation layer defining rows of the array.

After electro-plating metal side pads, a second series of parallel cuts is made extending fully through the leadframe and encapsulation layer. This separates the columns of the array thereby providing singulated packages. In such a process the I/O terminals will be exposed and since the I/O terminals are mutually electrically connected the exposed I/O terminals may be electroplated to form the metal side pads. The electrical connection is necessary to maintain electrical continuity so that the electroplating process can be achieved.

However, for leadless semiconductor devices having two separate functional dies and at least three I/O terminals located at one sidewall of the device and at least two I/O terminals located at an opposing sidewall, it may not be possible to form side pads by electroplating according to above process because the cutting sequence requires that middle I/O terminals located at one sidewall of the device formed on a leadframe structure on lead frame will be electrically isolated. FIG. 1a shows a typical lead frame structure 10 formed of a series of lead frame sub-structures.

Prior to the first cutting sequence to define rows, as discussed above, each of the six I/O terminals 12, 14 and 16 (three I/O terminals on two opposing sides of the device) for a specific device lead frame are electrically interconnected since they will be monolithically formed from a single piece of metal, typically by a photo etching process on sheet metal. Referring now to FIG. 1b, following the first cutting sequence (indicated by lines A) I/O terminals 12, 14 will be detached from the leadframe structure 10, and therefore it will not be possible to electroplate the I/O terminals 12, 14 to form metal side pads because they will be mechanically detached and electrically isolated from the leadframe structure.

Following the second cutting sequence which is substantially orthogonal to the first cutting sequence, (indicated by lines B) each individual sub-lead frame will be singulated from the leadframe structure 10.

SUMMARY

According to a first aspect there is provided method of forming a leadless packaged semiconductor device having a leadframe structure comprising an array leadframe sub-structures each having a semiconductor die arranged thereon, the method comprising: providing electrical connections between terminals of said lead frame sub-structures and said leadframe structure; encapsulating said leadframe structure, said electrical connections and said terminals in an encapsulation layer; performing a first series of parallel cuts extending through the leadframe structure and the encapsulation layer to expose a side portion of said terminals; electro-plating said terminals to form metal side pads; and performing a second series of parallel cuts angled with respect to the first series of parallel cuts, the second series of cuts extending through the lead frame structure and the encapsulation layer to singulate a semiconductor device from the leadframe structure.

Use of the electrical connections between terminals of the lead frame sub-structures and the leadframe structure allows for electroplating of the metal side pads.

The electrical connections may be sacrificial bond wires, such that the electrical connections can be easily carried out whilst wire bonding the semiconductor dies.

The sacrificial bond wires may each be provided between a terminal and a respective bond pad formed on said leadframe structure. The sacrificial bond wires are arranged to maintain electrical continuity between lead frame sub-structures following the first series of parallel cuts. Maintaining electrical continuity across an array of the lead frame sub-structures allows the metal side pads to be electroplated in a single step.

The second series of cuts may sever the sacrificial bond wires between the terminals and the leadframe structure. This removes the electrical connection between terminals that are wire bonded to the semiconductor dies and the lead frame sub-structures, thereby preventing a risk of short circuiting the semiconductor dies.

The leadframe structure may comprise at least five terminals and wherein at least two terminals may be disposed on one side of the leadframe structure and the remaining terminals may be disposed on an opposing side of the leadframe structure.

The leadframe sub-structures may further comprise tie bars arranged to connect at least one of said terminals to said leadframe structure, whereby said tie bars are severed by the second series of cuts. The bars may provide mechanical support for the terminal on the lead frame structure.

According to a second aspect there is provided leadless packaged semiconductor device having top and bottom opposing major surfaces and sidewalls extending there between, the leadless packaged semiconductor device comprising; a lead frame structure comprising of an array of two or more leadframe sub-structures each having a semiconductor die arranged thereon; a sacrificial bond wire comprising a first end bonded to said lead frame structure and second end terminating in a side wall; and at least five terminals wherein each of said terminals comprise a respective metal side pad.

The leadless packaged semiconductor device may therefore be amenable to optical inspection when mounted on a printed circuit board.

The terminals may be disposed on opposing side walls, wherein at least two terminals are disposed on one of said sidewalls and the remaining terminals are disposed on an opposing side wall.

Each of the leadframe sub-structures may comprise a die attach region comprising therewith an integrally formed terminal. Each of the two or more leadframe sub-structures may be electrically isolated. Each of metal side pads may be electroplated. A second end of said sacrificial bond wire may terminate in a sidewall adjacent sidewalls comprising the metal side pads.

DESCRIPTION OF THE DRAWINGS

The invention is described further hereinafter by way of example only with reference to the accompanying drawings in which:

FIG. 5b illustrates a cross-section y-y of FIG. 5a;

In the figures and the following description like reference numerals refer to like features.

Figure 1A:
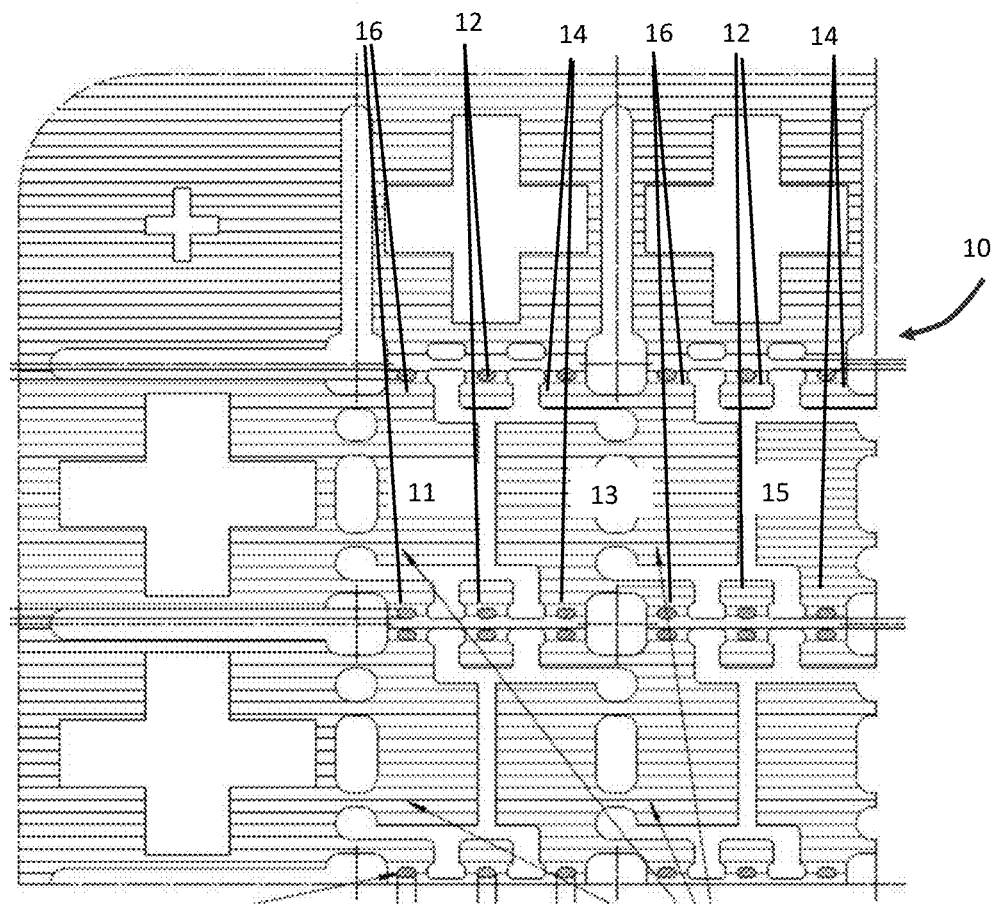
FIG. 1a shows a known lead frame structure.
Figure 1B:
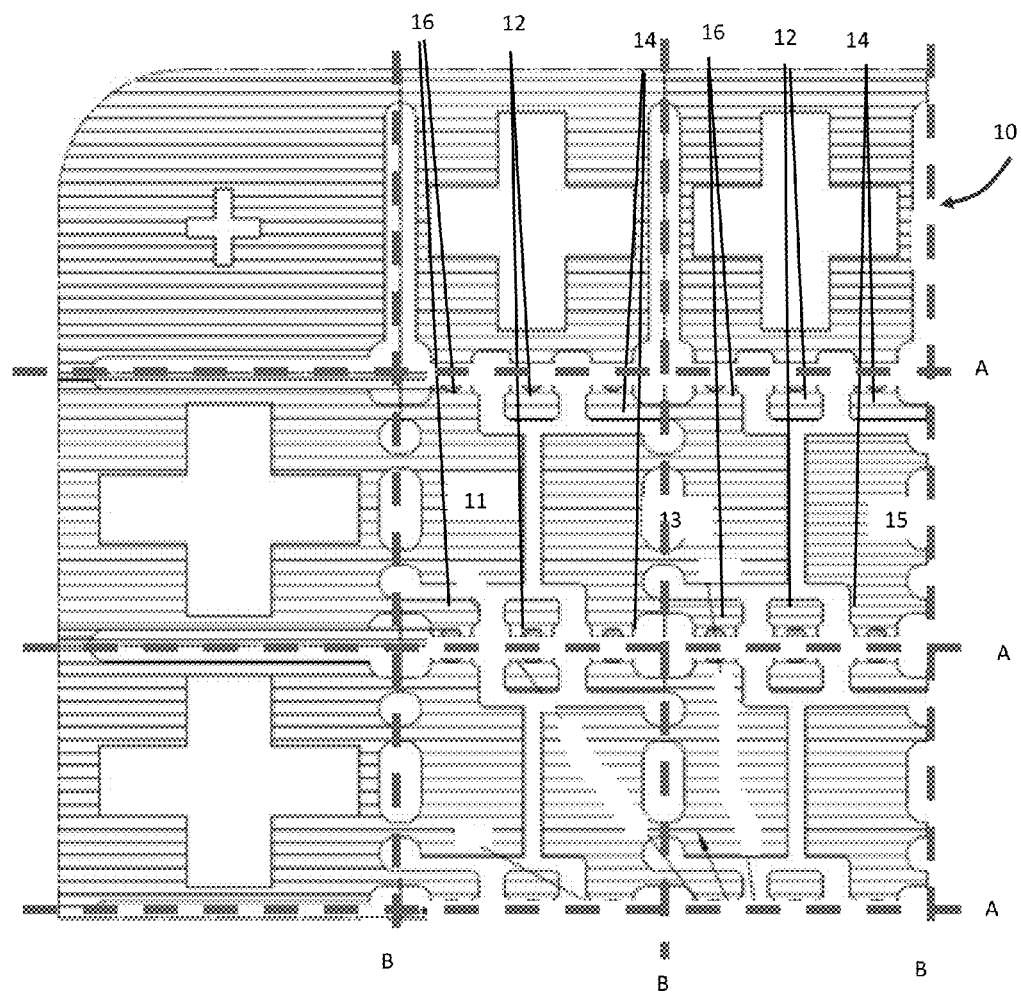
FIG. 1b shows a known lead frame structure indicating the location of singulation cuts.
Figure 2:
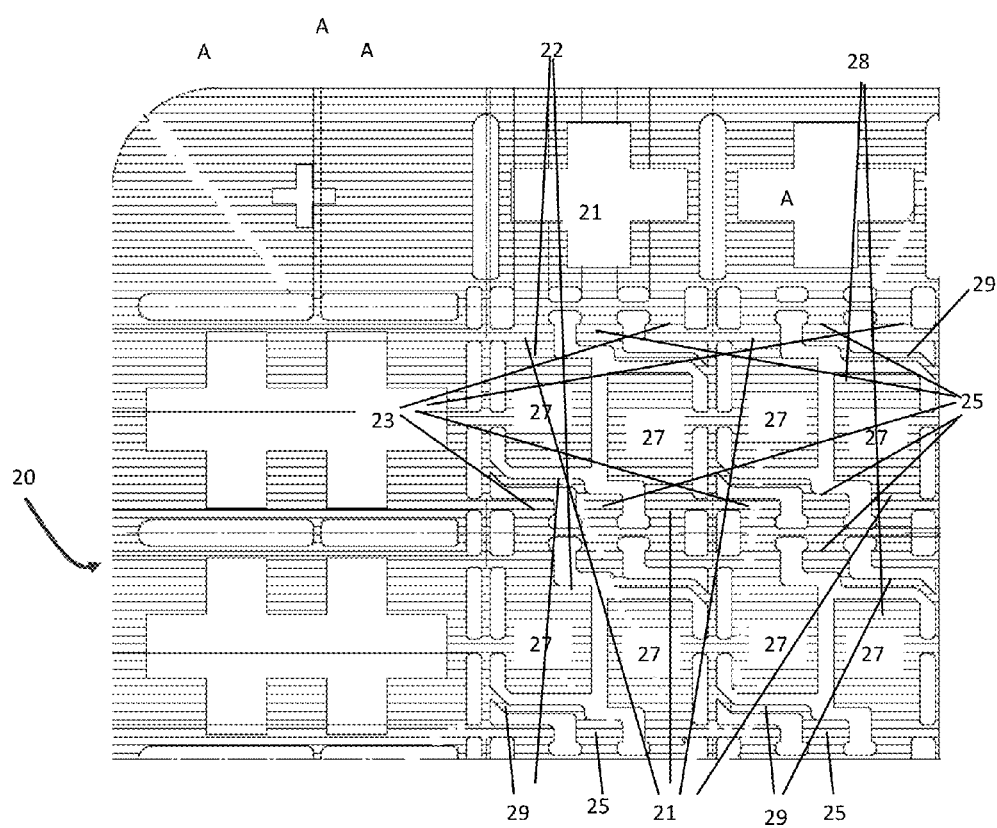
FIG. 2 illustrates a lead frame structure according to embodiments.

In overview, the lead frame structure 20, known as a unit structure, according to an embodiment is illustrated in FIG. 2. The lead frame structure 20 is formed of a two-dimensional (2D) array of interconnected sub-structures each of which constitutes single lead frames 22, 28 for a leadless packaged semiconductor device when singulated. In this example, each of the lead frames comprises two sets of three I/O terminals 21, 23, 25, however the skilled person will appreciate that the number of I/O terminals may vary as required by the package type. Each of the lead frames 22, 28 also comprises at least two die attach regions 27 onto each of which a device die (not illustrated in FIG. 2) may be attached, as discussed below. Each one of the two set of I/O terminals are associated with each one of the die attach regions 27 so that appropriate connections can be made to the device die. Applications requiring two dies include dual transistors arrangements such as cascode transistors or dual diodes.

The die attach region 27 is integrally connected to I/O terminal 21 and in this regard the die attach region 27 will remain integrally connected to the I/O terminal 21 following the singulation process discussed below. Prior to singulation each of the I/O terminals 23, 25 are integrally connected to the respective die attach region 27 by means of tie bars 29. The tie bars 29 connecting the die attach regions 27 to the I/O terminals 23, 25 are arranged to be broken during the singulation process, as discussed below. The I/O terminals are arranged such that they are formed along two parallel axes, known as the lead side axes, defining a row in the array.

The lead frame structure is typically formed from a sheet of metal copper alloy coated with palladium gold by a photo etching process.

Figure 3:
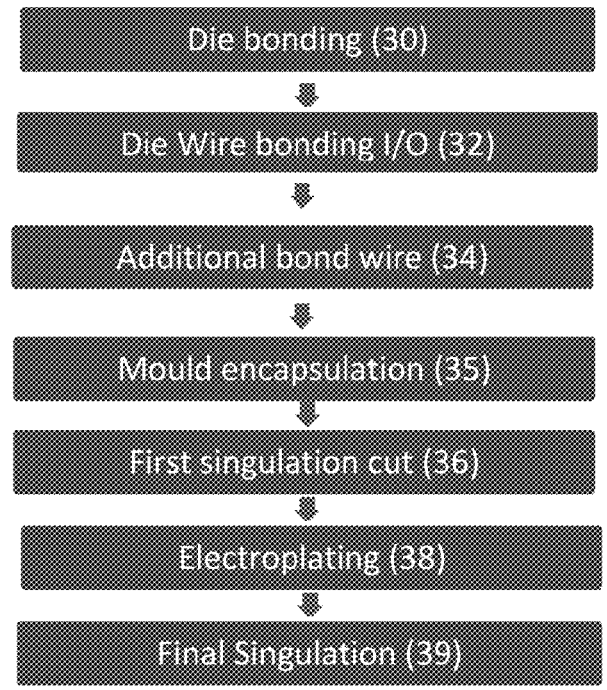
FIG. 3 illustrates a process flow for forming a leadless semiconductor device according to embodiments.

FIG. 3 illustrates a process flow diagram for fabricating a leadless packaged semiconductor device according to an embodiment. With reference to the process flow of FIG. 3 and the wire bonding scheme of FIG. 4, following formation of the lead frame structure 20 as discussed above, device dies 40 are attached to the die attach regions 27, by die bonding (process step 30). The device dies 40 may be attached to the die attach region by any appropriate means, such as eutectic bonds or glue adhesion between the die attach region 27 and a metallization of the device die 40. For example the metallization may be a backside metallization (not illustrated) of the device die 40. In this way a device die 40 is connected to a respective I/O terminal 21 both mechanically and electrically.

Figure 4:
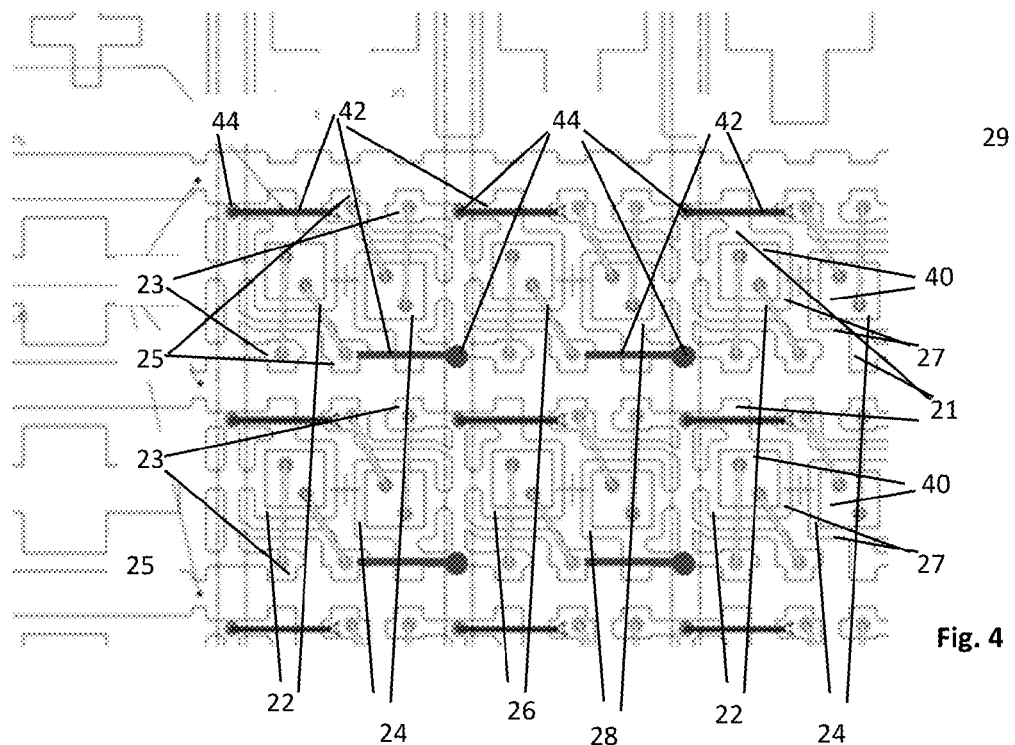
FIG. 4 illustrates a wire bonding scheme according to embodiments.

Also with reference to FIG. 4, following the die bonding step 30, wire bonds (process step 32) are connected from the contacts of the device dies 40 to the respective I/O terminals 23, 25 of the respective lead frames 22, 28. As well as die wire bonding devices to the I/O terminals 23, 25, additional wire bonds 42 are connected between the I/O terminal 25, and additional bond pads 44 formed on the lead frame structure 20 (process step 34). The die wire bonding and the additional wire bonding may be performed in a simultaneous process step. The additional wire bonds 42 are arranged substantially parallel to a direction of first singulation cuts (discussed below at process step 36) made in the lead frame structure whereby these cuts are a first series of parallel cuts that extend fully through the leadframe to define separate rows of lead frames 22, 28 from the lead frame structure 20. The additional wire bonds 42 are also arranged such that they are not cut during the first singulation cuts, but remain to provide electrical continuity between each of the lead frames 22, 28 forming the rows following the first singulation cut. By providing electrical continuity in this way it is possible to carry electroplating of metal side pads for each of the I/O terminals 21, 23, 25 as discussed below (see step 38), for each of the respective lead frames 22, 24, 26, 28 making up the row. The wire bond processes discussed above may be any appropriate wire bonding process using gold copper, aluminium, or silver wire, or using metal clip bonds.

Following the wire bonding (process steps 32 and 34), the array of lead frames 22, 28 are encapsulated in a mould compound. The encapsulation defines a first set of opposing side walls for the leadless packaged semiconductor device. This encapsulation process may be any appropriate process as understood by the skilled person.

Figure 5A:
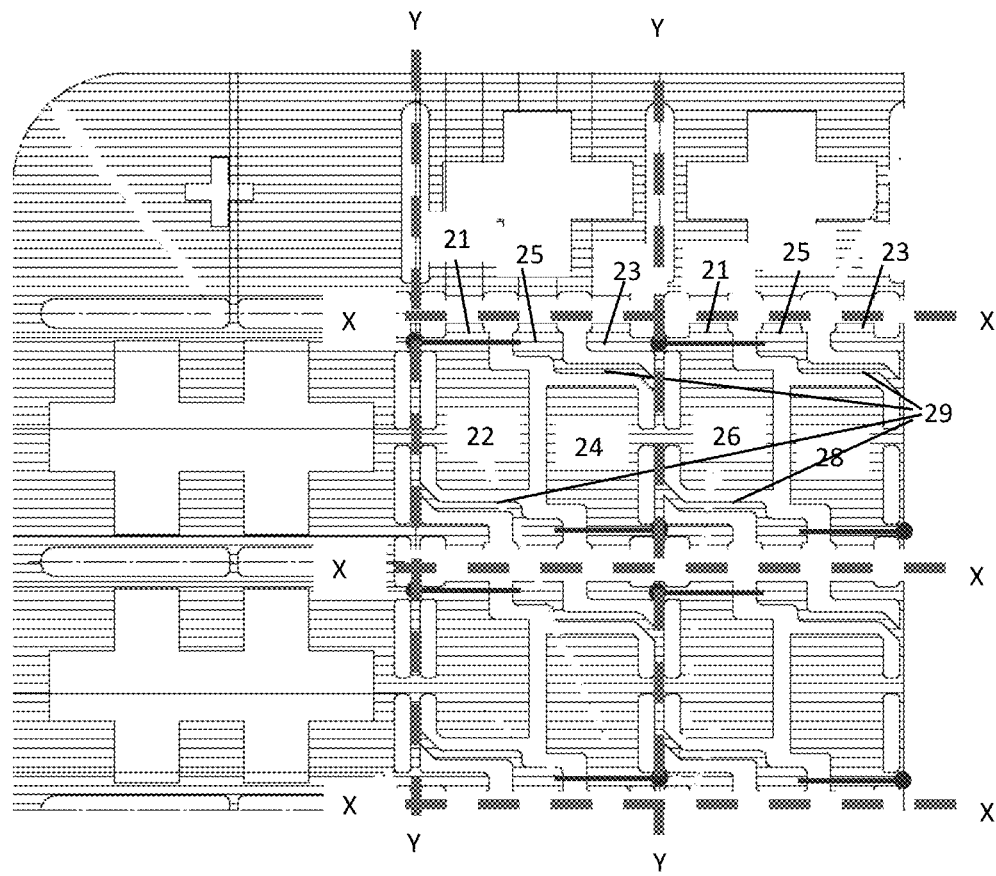
FIG. 5a illustrates a lead frame structure and wire bonding scheme according to embodiments following partial singulation.
Figure 5B:
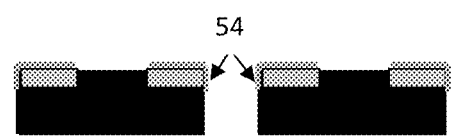

Following encapsulation, a first series of parallel cuts (as discussed above) are made in lead frame structure 20 (process step 36). With reference to FIG. 5a, the parallel series of cuts are singulation cuts, and are made along the path (X-X) following the line of the I/O terminals 21, 23, 25 so as to define separate rows of lead frames 22, 28. These first singulation cuts are such that the lead frames in a row of lead frames 22, 28 remain connected to the lead frame structure 20 at an end lead frame of a row and by connection to adjoining lead frames. The purpose of these cuts is to remove the encapsulation in the vicinity of the I/O terminals 21, 23, 25 so that they can be electroplated (in process step 38) as discussed below, to form metal side pads 54. Metal side pads 54 are illustrated in FIG. 5b which shows a cross-section Y-Y taken from FIG. 5a. The cuts are made in the direction X-X which follows the line of the I/O terminals 21, 23, 25 along the side lead axis. The cuts may extend through the encapsulation and the lead frame material but terminate at a tape material (not illustrated) such that each lead frame in a row remains mechanically connected to the tape. Following this cutting process, as shown in FIG. 5a, it can be seen that I/O terminals 25 of each lead frame 22, 28 in a row remain electrically connected to adjacent lead frames 22, 28 by means of the additional wire bonds 42. At either end of each row, the lead frames will be wire bonded to a point on the lead frame structure 20 so as to create inter-lead frame connections. By making these connections electroplating of the metal side pads 54 on each of the I/O terminals 21, 23, 25 is possible. Also, as shown in FIG. 5a, tie bars 29 may be included to provide mechanical support for the I/O terminals 25, 23 on the lead frame structure 20. The tie bars 29 also provide electrical connection to the lead frame structure 20. The tie bars 29 are arranged to be severed, following electroplating, during a second series of parallel cuts (process step 39 discussed below) such that the I/O terminals 25, 23 do not short circuit to the die attach region 27.

Following the first series of cuts, electroplating (process step 38) of the I/O terminals 21, 23, 25 is carried out so as to form the metal side pads 54. The electroplating can be achieved by any appropriate process as understood by those skilled in the art. Typically, the metal side pads 54 will be plated with tin or alternatively lead or a tin-lead compound. Through use of the additional wire bonds 42 the electrical continuity necessary for electroplating the I/O terminals 21, 23, 25 of each lead frame 22, 28 in a row in a single step is achieved. In this way, the exposed metal of the I/O terminals 21, 23, 25 of each lead frame act as a plating electrode in the electroplating process.

Figure 5C:
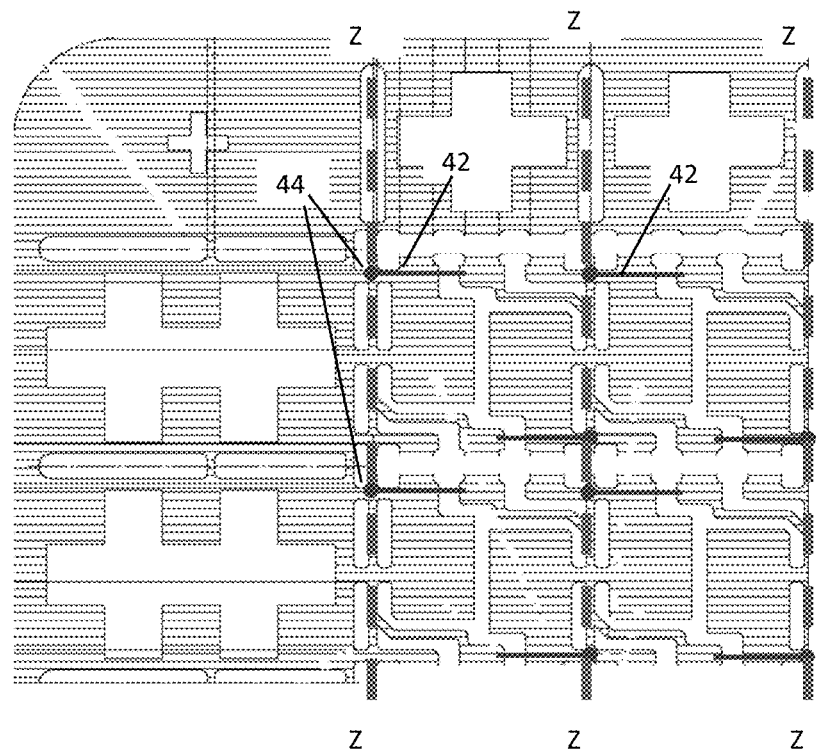
FIG. 5c illustrates a lead frame structure and wire bonding scheme according to embodiments following singulation.

Following the electroplating step, a second series of parallel cuts (as discussed above) are made in lead frame structure 20 (process step 39). With reference to FIG. 5c the second series of parallel cuts are final singulation cuts which completes the singulation process, and are made in a direction (Z-Z) at an angle to the first series of cuts and separate each of lead frames 22, 28 from the lead frame structure 20 and/or an adjacent lead frame 22, 28. These cuts define a second set of opposing side walls for each singulated device. The angle of the second series of cuts may be orthogonal to the first series.

This final singulation step severs the additional wire bonds 42. The additional wire bonds 42 may be severed by cutting through the additional bond pads 44. In this regard the bond wire may be considered as sacrificial. The severed additional wire bonds 42 may remain embedded within the encapsulation but are functionally obsolete. The singulation step also severs the tie bars 29, such that the I/O terminals 25, 23 do not short circuit to the die attach region 27. Additionally, the I/O terminals will now not be mutually connected as a result of the final singulation.

Additional processing steps may include deflashing, to remove any encapsulation compound from the I/O terminals, which may be performed before electroplating of the metal side pads. Further cleaning steps may be used to remove material from the final device following singulation. A visual inspection of the final may also be carried out.

Figure 6A:
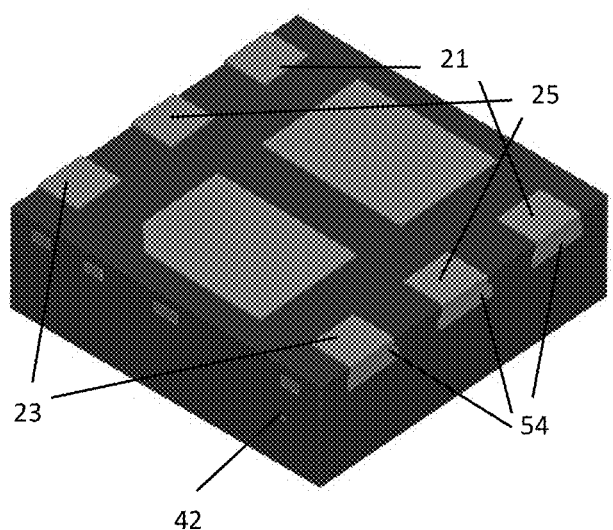
FIG. 6a illustrates an underside view of completed leadless semiconductor device according to embodiments.
Figure 6B:
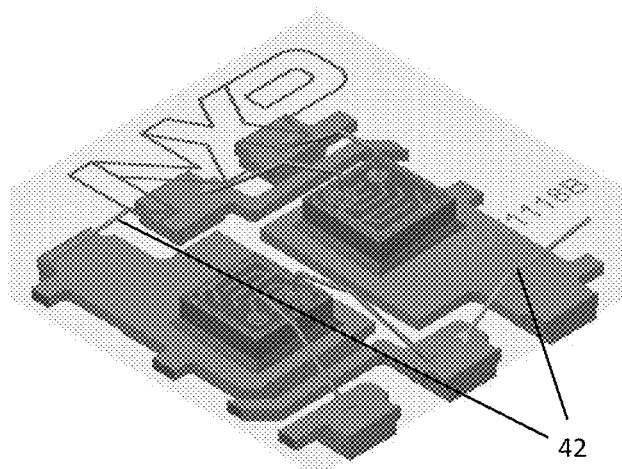
FIG. 6b illustrates a cut-away view of the completed leadless semiconductor device.

FIG. 6a shows perspective underside view of a completed leadless semiconductor device according to an embodiment. The metal side pads 54 are formed on a side wall of the device from respective I/O terminals 21, 23, 25. As the skilled person will appreciate metal side pads (obscured from view in FIG. 6a) are also provided on the opposing side wall of the device. A severed and now functionally obsolete additional bond wire 42 may be seen in an adjacent side wall of the device, that is sidewalls adjacent the sidewalls on which the metal side pads are formed. As shown in FIG. 6b the additional bond wires 42 are severed at one end from the lead frame structure 20 such that they no longer provide electrical continuity as discussed above.

Whilst the skilled person will appreciate that the additional bond wire 42 may be obsolete in terms of device operation, they may provide electrical connections to the device for use in for example device testing or programming.

Whilst the above discussion relates to leadless packaged semiconductor devices having three or more I/O terminals on each opposing side of the device (that is arranged as a so-called dual in line arrangement), and with two or more electrically isolated die attach regions 27, the process can be used for multiple I/O terminal configurations and multiple electrically isolated die attached regions. The skilled person will appreciate that I/O terminals and die attached regions need to be electrically connected to each other after the first cut, so as to allow for electroplating and then mutually electrically separated so as to allow for correct functioning of the device dies and ultimately the final packaged device.

Particular and preferred aspects of the invention are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed invention or mitigate against any or all of the problems addressed by the present invention. The applicant hereby gives notice that new claims may be formulated to such features during prosecution of this application or of any such further application derived there from. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

Term "comprising" does not exclude other elements or steps, the term "a" or "an" does not exclude a plurality. Reference signs in the claims shall not be construed as limiting the scope of the claims.

The invention claimed is:

1. A method of forming a leadless packaged semiconductor device having a leadframe structure comprising an array leadframe sub-structures each having a semiconductor die arranged thereon, the method comprising:
   providing electrical connections between terminals of said lead frame sub-structures and said leadframe structure;
   encapsulating said leadframe structure, said electrical connections and said terminals in an encapsulation layer;
   performing a first series of parallel cuts extending through the leadframe structure and the encapsulation layer to expose a side portion of said terminals;
   electro-plating said terminals to form metal side pads; and
   performing a second series of parallel cuts angled with respect to the first series of parallel cuts, the second series of cuts extending through the lead frame structure and the encapsulation layer to singulate a semiconductor device from the leadframe structure, wherein the leadframe structure includes at least two die attach regions.

2. The method of claim 1, wherein said electrical connections are sacrificial bond wires.

3. The method of claim 2, wherein said sacrificial bond wires are each provided between a terminal of a leadframe sub-structure and a respective bond pad formed on said leadframe structure.

4. The method of claim 3, wherein said sacrificial bond wires are arranged to maintain electrical continuity between lead frame sub-structures following the first series of parallel cuts.

5. The method of claim 2, wherein performing the second series of cuts sever the sacrificial bond wires between said terminals and the leadframe structure.

6. The method of claim 1, wherein leadframe structure comprises at least five terminals and wherein at least two terminals are disposed on one side of a leadframe sub-structure and the remaining terminals are on an opposing side of leadframe sub-structure.

7. The method of claim 1, wherein said leadframe sub-structures further comprise tie bars arranged to connect at least one of said terminals to said leadframe structure, whereby said tie bars are severed by the second series of cuts.

8. A leadless packaged semiconductor device having top and bottom opposing major surfaces and sidewalls extending there between, the leadless packaged semiconductor device comprising;
   a lead frame structure comprising of an array of two or more leadframe sub-structures each having a semiconductor die arranged thereon;
   a sacrificial bond wire comprising a first end bonded to said lead frame structure and second end terminating in a side wall; and
   at least five terminals wherein each of said terminals comprise a respective metal side pad.

9. The leadless packaged semiconductor device of claim 8, wherein the terminals are disposed on opposing side walls, wherein at least two terminals are disposed on one of said sidewalls and the remaining terminals are disposed on an opposing side wall.

10. The leadless packaged semiconductor device of claim 8, wherein each of the leadframe sub-structures comprise a die attach region comprising therewith an integrally formed terminal.

11. The leadless packaged semiconductor device of claim 8, wherein each of two or more leadframe sub-structures are electrically isolated.

12. The leadless packaged semiconductor device of claim 9, wherein each of metal side pads are electroplated.

13. The leadless packaged semiconductor device of claim 9, wherein the second end of said sacrificial bond wire terminates in a sidewall adjacent sidewalls comprising the metal side pads.

14. A method of forming a leadless packaged semiconductor device having a leadframe structure comprising an array leadframe sub-structures each having a semiconductor die arranged thereon, the method comprising:
   providing electrical connections between terminals of said lead frame sub-structures and said leadframe structure, wherein said electrical connections are sacrificial bond wires;
   encapsulating said leadframe structure, said electrical connections and said terminals in an encapsulation layer;
   performing a first series of parallel cuts extending through the leadframe structure and the encapsulation layer to expose a side portion of said terminals;
   electro-plating said terminals to form metal side pads; and
   performing a second series of parallel cuts angled with respect to the first series of parallel cuts, the second series of cuts extending through the lead frame structure and the encapsulation layer to singulate a semiconductor device from the leadframe structure,
   wherein the sacrificial bond wires are each provided between a terminal of a leadframe sub-structure and a respective bond pad formed on said leadframe structure.

15. The method of claim 14, wherein said sacrificial bond wires are arranged to maintain electrical continuity between lead frame sub-structures following the first series of parallel cuts.

* * * * *